United States Patent
Pittikoun

(10) Patent No.: US 7,148,107 B1
(45) Date of Patent: Dec. 12, 2006

(54) METHOD OF FABRICATING NON-VOLATILE MEMORY

(75) Inventor: Saysamone Pittikoun, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/164,211

(22) Filed: Nov. 15, 2005

(30) Foreign Application Priority Data

Aug. 9, 2005 (TW) .............................. 94126920 A

(51) Int. Cl.
*H01L 21/8247* (2006.01)

(52) U.S. Cl. .................. 438/258; 257/E21.209
(58) Field of Classification Search ........ 438/257–267; 257/E21.209
See application file for complete search history.

(56) References Cited

U.S. PATENT DOCUMENTS 6,927,129 B1 *   8/2005   Sun et al. ................... 438/258
2002/0132428 A1 * 9/2002   Chien et al. ................ 438/258
2005/0176202 A1 * 8/2005   Hisamoto et al. ........... 438/257

* cited by examiner

Primary Examiner—Richard A. Booth
(74) Attorney, Agent, or Firm—Jianq Chyun IP Office

(57) ABSTRACT

A method of fabricating a non-volatile memory is described. A substrate having a memory cell region and a peripheral circuit region is provided. A plurality of first stacked gate structures is formed on the memory cell region and a stacked structure is formed on the peripheral circuit region. A conductive layer is formed on the substrate to form a plurality of gates between the first stacked gate structures, thereby forming a memory cell row. A plurality of conductive spacers is formed on the sidewalls of the memory cell row and the stacked structure. A patterned mask layer is formed on the substrate to cover at least the memory cell row and the conductive spacers. The stacked structure is patterned to form a plurality of second stacked gate structures on the peripheral circuit region.

22 Claims, 9 Drawing Sheets

METHOD OF FABRICATING NON-VOLATILE MEMORY

CROSS-REFERENCE TO RELATED APPLICATION

This application claims the priority benefit of Taiwan application serial no. 94126920, filed on Aug. 9, 2005. All disclosure of the Taiwan application is incorporated herein by reference.

BACKGROUND OF THE INVENTION

1. Field of the Invention

The present invention relates to a method of fabricating a semiconductor device. More particularly, the present invention relates to a method of fabricating a non-volatile memory.

2. Description of the Related Art

Memory is a semiconductor device for storing data or programs. As the functional capability of the microprocessor inside a computer becomes more powerful, the programs that can be run by software are growing larger and so more memory is demanded. To fabricate larger capacity and inexpensive memory to meet the demands, innovation techniques and processes for fabricating memory devices are sought. In fact, it has become the driving power for increasing the level of integration in semiconductor production.

Among various types of memory products, non-volatile memory is a type of memory whose stored data can be programmed, read and erase multiples of times. Furthermore, the stored data is retained even when the power to the device has been turn off. Hence, non-volatile memory is a memory device that has been widely adopted inside personal computer and electronic equipment.

FIGS. 1A through 1C are schematic cross-sectional views showing the steps for fabricating a conventional non-volatile memory device. First, as shown in FIG. 1A, a substrate 100 is provided. The substrate 100 has a memory cell region 101 and a peripheral circuit region 103. A tunneling dielectric layer 102, a charge-trapping layer 104, a barrier dielectric layer 105, a pad conductive layer 110, a conductive layer 112 and a patterned cap layer 114 have already formed over the substrate 100 on the memory cell region 101. Furthermore, a gate oxide layer 108, a conductive layer 112 and a patterned cap layer 114 have already formed over the substrate 100 on the peripheral circuit region 103. Then, the conductive layer 112 and the pad conductive layer 110 are defined using the patterned cap layer 114. Therefore, a plurality of stacked gate structures 116 is formed on the memory cell region 101 and a plurality of stacked gate structures 116a is formed on the peripheral circuit region 103.

As shown in FIG. 1B, a plurality of dielectric layers 117 is formed on the sidewalls of the stacked gate structures 116 and 116a. Then, a conductive layer (not shown) is formed over the substrate 100. Thereafter, a portion of the conductive layer is removed to expose the surface of the stacked gate structures 116 and the stacked structures 116a. Thus, a plurality of gates 118 are formed between neighboring stacked gate structures 116 to produce a memory cell row 120. A plurality of conductive spacers 122 is also formed on the sidewalls of the stacked gate structures 116 and 116a.

As shown in FIG. 2C, the barrier dielectric layer 106, the charge-trapping layer 104 and the tunneling dielectric layer 102 not covered by the memory cell row 120 and the gate oxide layer 108 not covered by the stacked gate structures 116a are removed. Thereafter, a plurality of source/drain regions 124 is formed in the substrate 100 on the respective sides of the stacked gate structures 116 and 116a.

In FIG. 1B of the foregoing process, the spacers between two neighboring stacked gate structures 116 are used to form another stacked gate structure 118 on the memory cell region 101 for increasing the level of integration of the devices. However, in the process of forming the stacked gate structure 118 on the memory cell region 101, conductive spacers 122 are also formed on the sidewalls of the stacked gate structures 116a on the peripheral circuit region 103. Hence, an additional process must be carried out to remove the conductive spacers 122, thereby complicating the production process and increasing the production cost.

SUMMARY OF THE INVENTION

Accordingly, at least one objective of the present invention is to provide a method of fabricating a non-volatile memory that can prevent conductive spacers from forming on the sidewalls of a stacked gate structure, simplify the production process and reduce cost.

To achieve these and other advantages and in accordance with the purpose of the invention, as embodied and broadly described herein, the invention provides a method of fabricating a non-volatile memory. First, a substrate having a memory cell region and a peripheral circuit region is provided. Furthermore, a plurality of first stacked gate structures has been formed on the memory cell region of the substrate and a stacked structure has been formed on the peripheral circuit region of the substrate. Then, a conductive layer is formed on the substrate and the conductive layer is etched back to form a plurality of gates between the first stacked gate structures, thereby producing a memory cell row. A plurality of conductive spacers is also formed on the sidewalls of the memory cell row and the stacked structure. Thereafter, a patterned mask layer is formed on the substrate. The patterned mask layer at least covers the memory cell row and the conductive spacers. After that, the stacked structure is patterned to form a plurality of second stacked gate structures on the peripheral circuit region.

According to the method of fabricating a non-volatile memory in the embodiment of the present invention, a plurality of source/drain regions can also form in the substrate on the respective sides of the memory cell row and the second stacked gate structures.

According to the method of fabricating a non-volatile memory in the embodiment of the present invention, the method of forming the source/drain regions includes performing an ion implant process, for example.

According to the method of fabricating a non-volatile memory in the embodiment of the present invention, before forming the conductive layer, further includes forming a plurality of dielectric layers on the sidewalls of the first stacked gate structures and the stacked structure.

According to the method of fabricating a non-volatile memory in the embodiment of the present invention, the dielectric layer is fabricated using silicon oxide, for example.

According to the method of fabricating a non-volatile memory in the embodiment of the present invention, the stacked gate structure includes a pad conductive layer, a conductive layer and a patterned cap layer, for example.

According to the method of fabricating a non-volatile memory in the embodiment of the present invention, the stacked structure includes a pad conductive layer, a conductive layer and a patterned cap layer, for example.

According to the method of fabricating a non-volatile memory in the embodiment of the present invention, the conductive layer is fabricated using doped polysilicon, for example.

The present invention also provides a method of fabricating a non-volatile memory. First, a substrate having a memory cell region and a peripheral circuit region is provided. Furthermore, a tunneling dielectric layer, a charge-trapping layer and a barrier dielectric layer have already formed in sequence on the memory cell region of the substrate and a gate oxide layer has already formed on the peripheral circuit region of the substrate. Then, a device isolation structure is formed in the substrate to define a plurality of first active regions on the memory cell region and a second active region on the peripheral circuit region. Thereafter, a plurality of first memory units is formed in the memory cell region and a stacked structure that at least covers the second active region is formed on the peripheral circuit region. A first conductive layer is formed on the substrate and the conductive layer is etched back to form a plurality of second memory cell units between the first memory units, thereby forming a memory cell row. Furthermore, a plurality of conductive spacers is formed on the sidewalls of the memory cell row and the stacked structure. After that, a patterned mask layer is formed on the substrate. The patterned mask layer at least covers the memory cell row and the conductive spacers. Then, the stacked structure is patterned to form a stacked gate structure on the second active region on the peripheral circuit region. Finally, a plurality of source/drain regions is formed in the substrate on the respective sides of the memory cell row and the stacked gate structure.

According to the method of fabricating a non-volatile memory in the embodiment of the present invention, the method of forming the device isolation structure includes the following steps. First, a cap layer is formed over the pad conductive layer. Then, a plurality of openings is formed through the cap layer, the pad conductive layer, the barrier dielectric layer, the charge-trapping layer, the tunneling dielectric layer and a portion of the substrate on the memory cell region and the pad conductive layer, the gate oxide layer and a portion of the substrate on the peripheral circuit region. Thereafter, dielectric material is deposited into the openings. After that, the cap layer and a portion of the dielectric material are removed.

According to the method of fabricating a non-volatile memory in the embodiment of the present invention, the method of forming the first memory units and the stacked structure includes forming a second conductive layer on the pad conductive layer and defining the second conductive layer and the pad conductive layer thereafter.

According to the method of fabricating a non-volatile memory in the embodiment of the present invention, the method of forming the second memory units includes forming a composite dielectric layer on the substrate and forming a third conductive layer between neighboring first memory units.

According to the method of fabricating a non-volatile memory in the embodiment of the present invention, the composite dielectric layer is an oxide/nitride/oxide composite stacked layer, for example.

According to the method of fabricating a non-volatile memory in the embodiment of the present invention, the method of forming the tunneling dielectric layer includes performing a thermal oxidation process, for example.

According to the method of fabricating a non-volatile memory in the embodiment of the present invention, the method of forming the charge-trapping layer includes performing a chemical vapor deposition process, for example.

According to the method of fabricating a non-volatile memory in the embodiment of the present invention, the charge-trapping layer is fabricated using silicon nitride or doped polysilicon, for example.

According to the method of fabricating a non-volatile memory in the embodiment of the present invention, the method of forming the barrier dielectric layer includes performing a chemical vapor deposition process, for example.

According to the method of fabricating a non-volatile memory in the embodiment of the present invention, the barrier dielectric layer is fabricated using silicon oxide, for example.

According to the method of fabricating a non-volatile memory in the embodiment of the present invention, the method of forming the gate oxide layer includes performing a wet oxidation process, for example.

According to the method of fabricating a non-volatile memory in the embodiment of the present invention, the gate oxide layer is fabricated using silicon oxide, for example.

According to the method of fabricating a non-volatile memory in the embodiment of the present invention, the pad conductive layer is fabricated using doped polysilicon, for example.

In the method of fabricating a non-volatile memory according to the present invention, the second stacked gate structures is defined by the stacked structure after forming the gate and the conductive spacers. Therefore, no conductive spacers are formed on the sidewalls of the second stacked gate structures. In addition, the conductive layers of the stacked gate structures in both the memory cell region and the peripheral circuit region are formed simultaneously, that is, the same conductive layer. Hence, the production process is simplified and the production cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
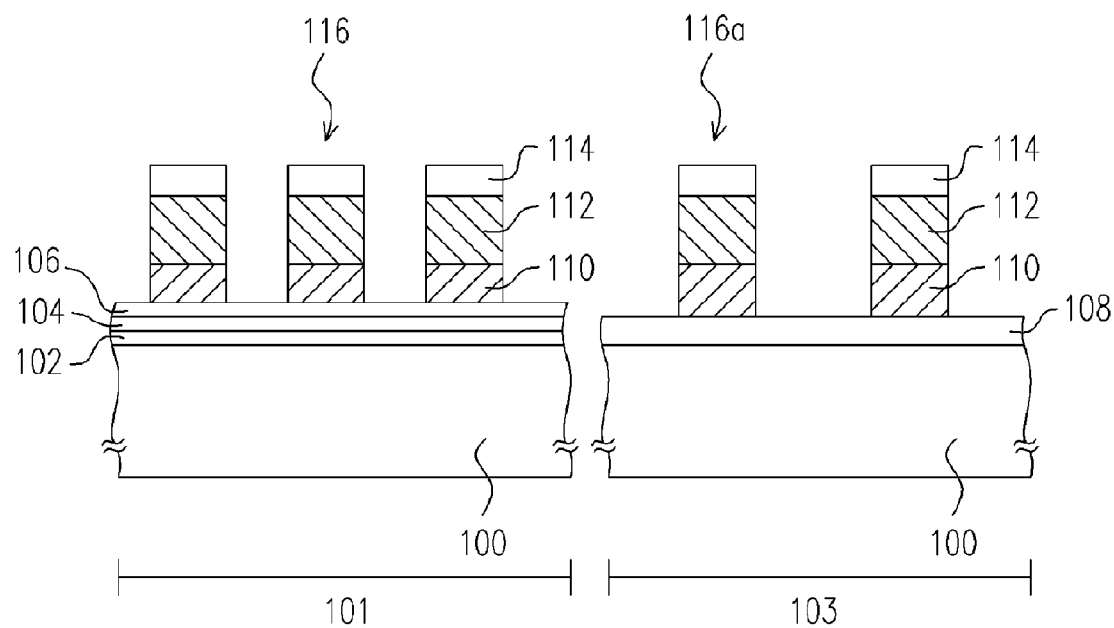
FIGS. 1A through 1C are schematic cross-sectional views showing the steps for fabricating a conventional non-volatile memory device.
Figure 1B:
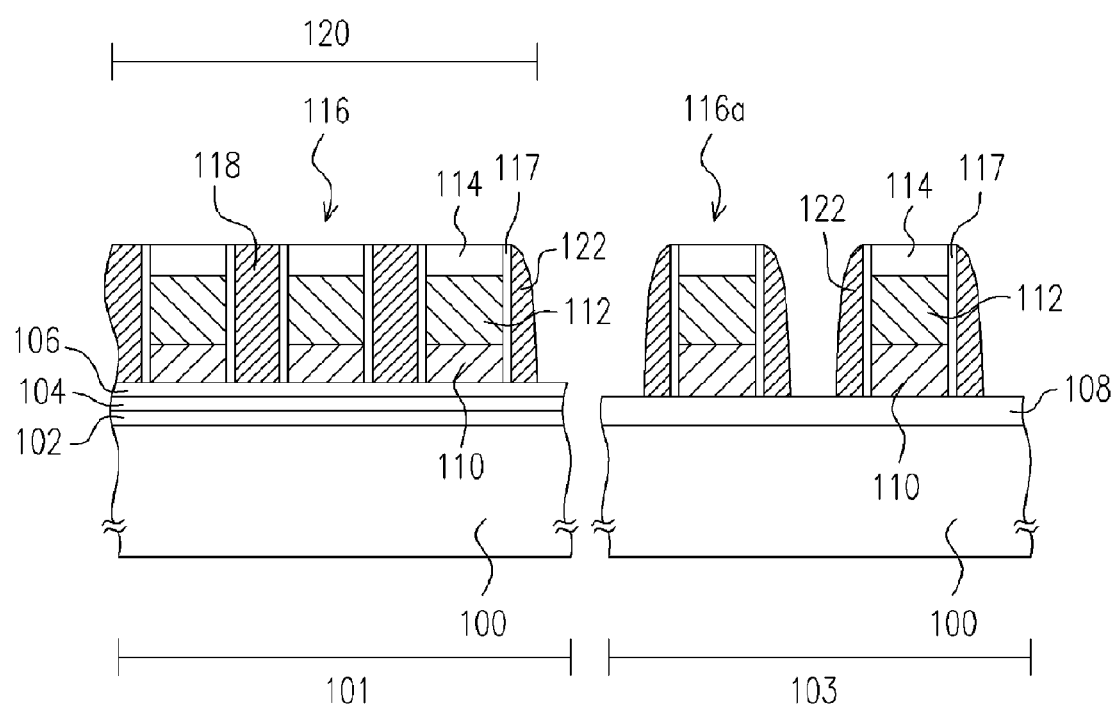
Figure 1C:
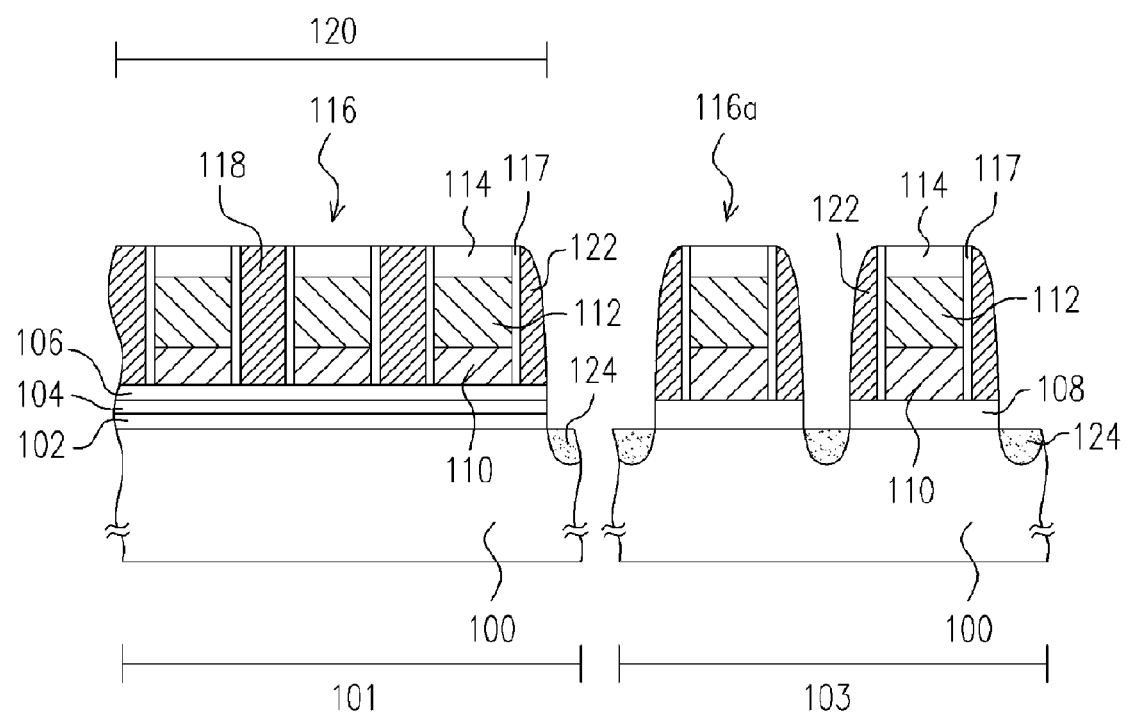

Reference will now be made in detail to the present preferred embodiments of the invention, examples of which are illustrated in the accompanying drawings. Wherever possible, the same reference numbers are used in the drawings and the description to refer to the same or like parts.

Figure 2A:
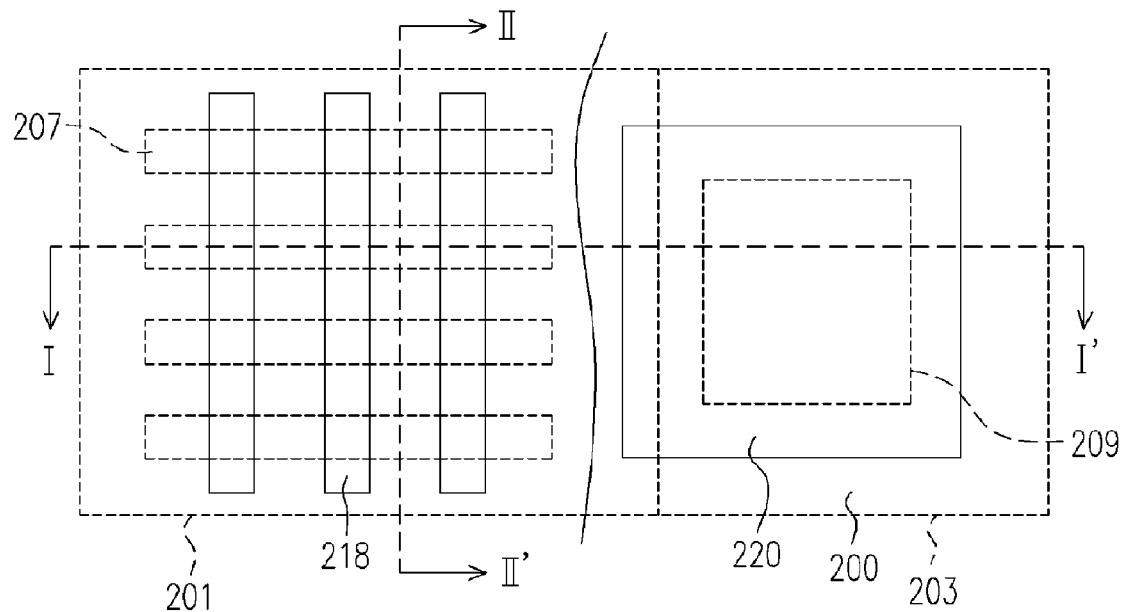
FIGS. 2A through 2C are top views showing the steps for fabricating the trench isolation structure of a non-volatile memory device according to the embodiment of the present invention.
Figure 2B:
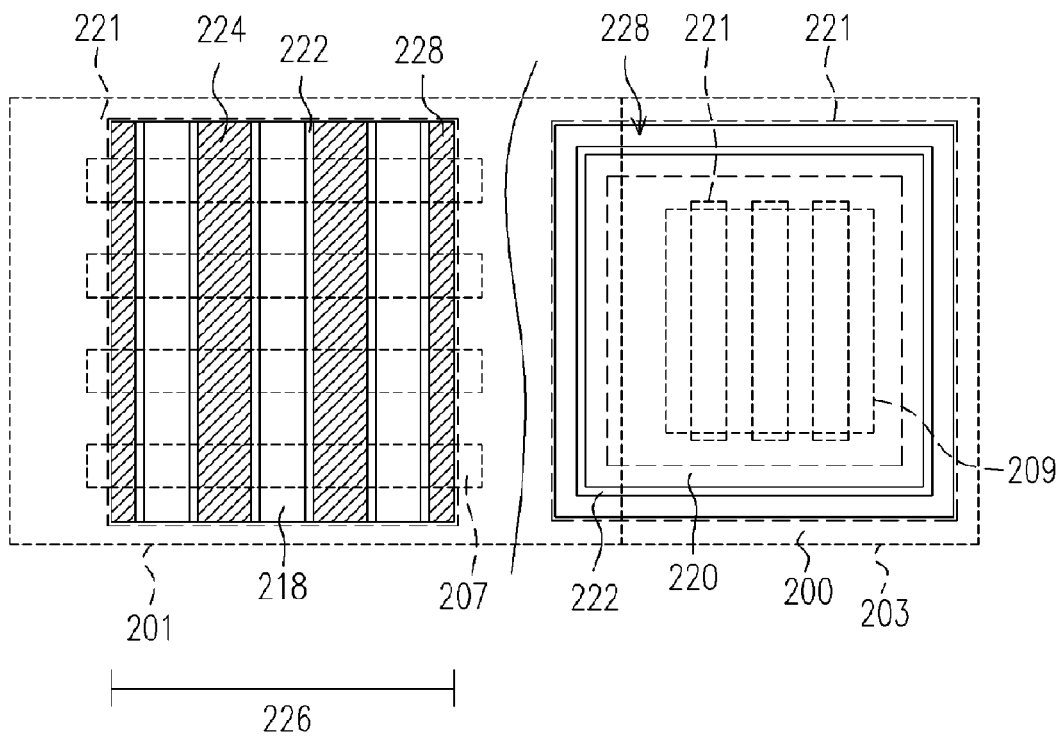
Figure 2C:
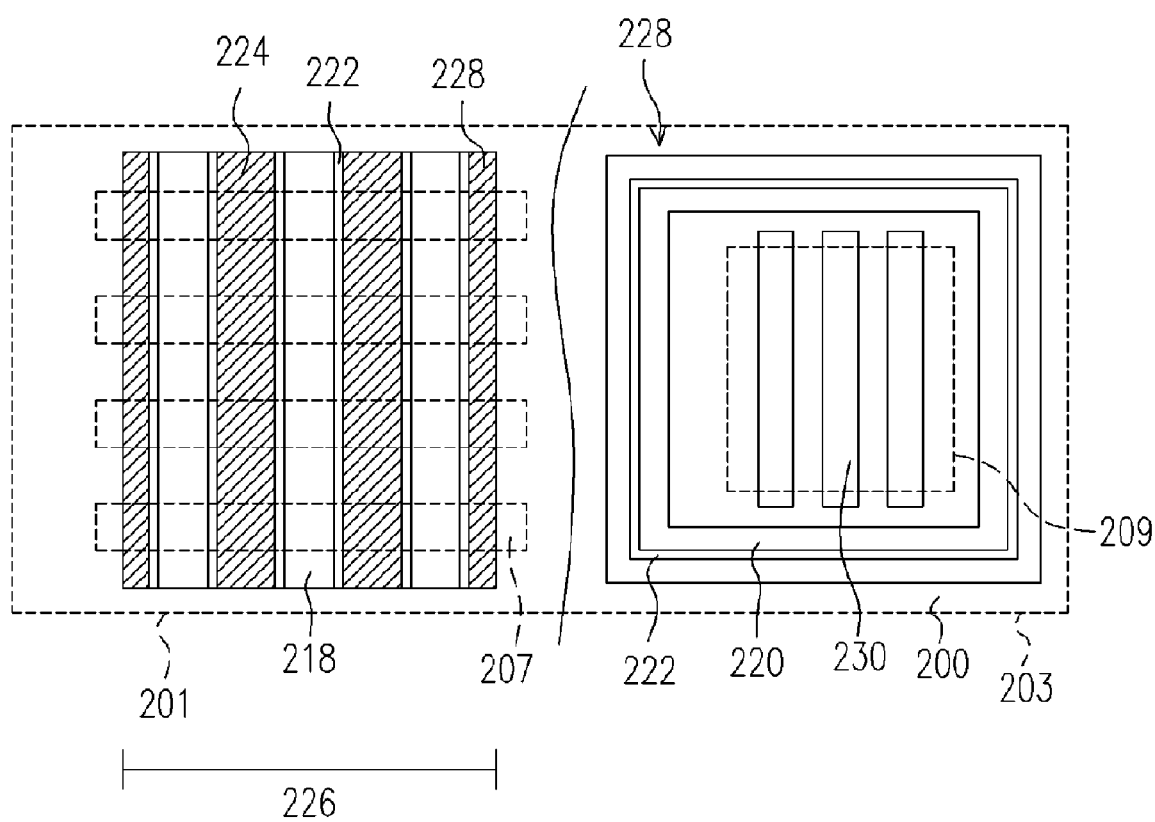
Figure 3A:
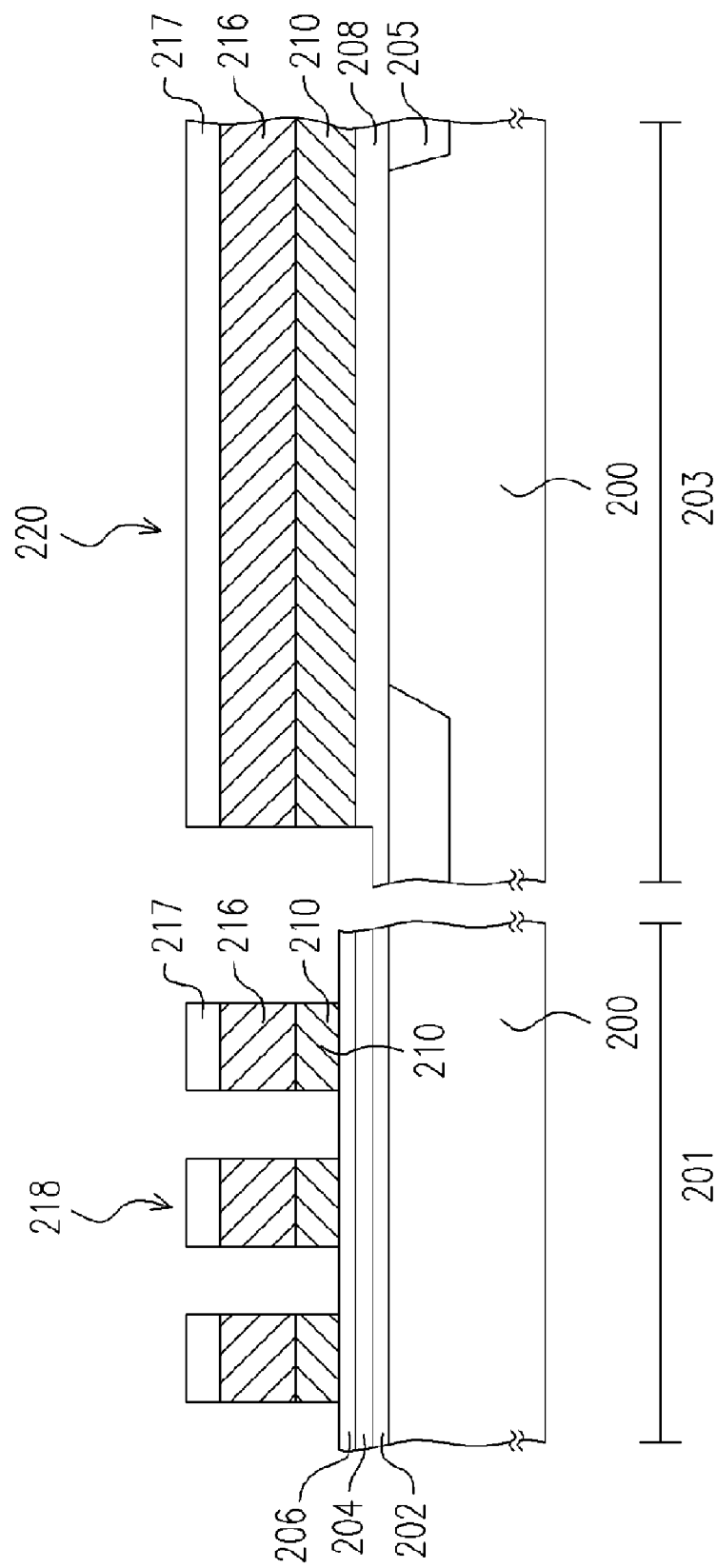
FIGS. 3A through 3D are schematic cross-sectional views along line I–I' of FIG. 2A showing the steps for fabricating a non-volatile memory.

FIGS. 2A through 2C are top views showing the steps for fabricating the trench isolation structure of a non-volatile memory device according to the embodiment of the present invention. FIGS. 3A through 3D are schematic cross-sectional views along line I–I' of FIG. 2A showing the steps for fabricating a non-volatile memory. FIG. 4 is a schematic cross-sectional view along line II–II' of FIG. 2A. As shown in FIGS. 2A and 3A, a substrate 200 having a memory cell region 201 and a peripheral circuit region 203 is provided. Furthermore, a tunneling dielectric layer 202, a charge-trapping layer 204 and a barrier dielectric layer 206 have already formed in sequence on the memory cell region 201 of the substrate 200 and a gate oxide layer 208 has already formed on the peripheral circuit region 203 of the substrate 200. The tunneling dielectric layer 202 is a silicon oxide layer formed, for example, by performing a thermal oxidation process. The charge-trapping layer 204 is a silicon nitride layer formed, for example, by performing a chemical vapor deposition process. The barrier dielectric layer 206 is a silicon oxide layer formed, for example, by performing a chemical vapor deposition process. The gate oxide layer 208 is a silicon oxide layer formed, for example, by performing a wet oxidation process. Then, a pad conductive layer 210 is formed on the substrate. The pad conductive layer 210 is fabricated using doped polysilicon, for example. Thereafter, a device isolation structure 205 is formed in the substrate 200 to define a plurality of active regions 208 on the memory cell region 201 and an active region 209 on the peripheral circuit region 203.

Thereafter, a cap layer (not shown) is formed on the pad conductive layer 210. Then, the cap layer and the pad conductive layer 210 are patterned. After that, an etching operation is performed to form a plurality of openings 213 in the substrate 200 within the memory cell region 201 and the peripheral circuit region 203. A dielectric material layer (not shown) is formed over the substrate 200. Then, the cap layer and a portion of the dielectric material layer are removed to form the device isolation structure 205 as shown in FIG. 4.

As shown in FIGS. 2A and 3A, a plurality of stacked gate structures 218 perpendicular to the active region 207 is formed on the memory cell region 201. Then, a stacked structure 220 that covers at least the active region 209 is formed on the peripheral circuit region 203. The method of forming the stacked gate structures 218 and the stacked structure 220 includes the following steps. First, a conductive layer 216 is formed over the pad conductive layer 210. The conductive layer is a doped polysilicon layer formed, for example, by performing a chemical vapor deposition process to form an undoped polysilicon layer and performing an ion implant process thereafter. Thereafter, a patterned cap layer 217 is formed on the conductive layer 216. The patterned cap layer 217 is fabricated using silicon nitride, for example. Then, using the patterned cap layer 217 as a mask, the conductive layer 216 and the pad conductive layer 210 are defined. Hence, the stacked gate structures 218 aligned in a direction perpendicular to the active region 207 on the memory cell region 201 and the stacked structure 220 that covers at least the active region 209 on the peripheral circuit region 203 are formed. In the present embodiment, the assembly including the pad conductive layer 210, the conductive layer 216 and the patterned cap layer 217 on the peripheral circuit region 203 is considered as a stacked structure 220.

Figure 3B:
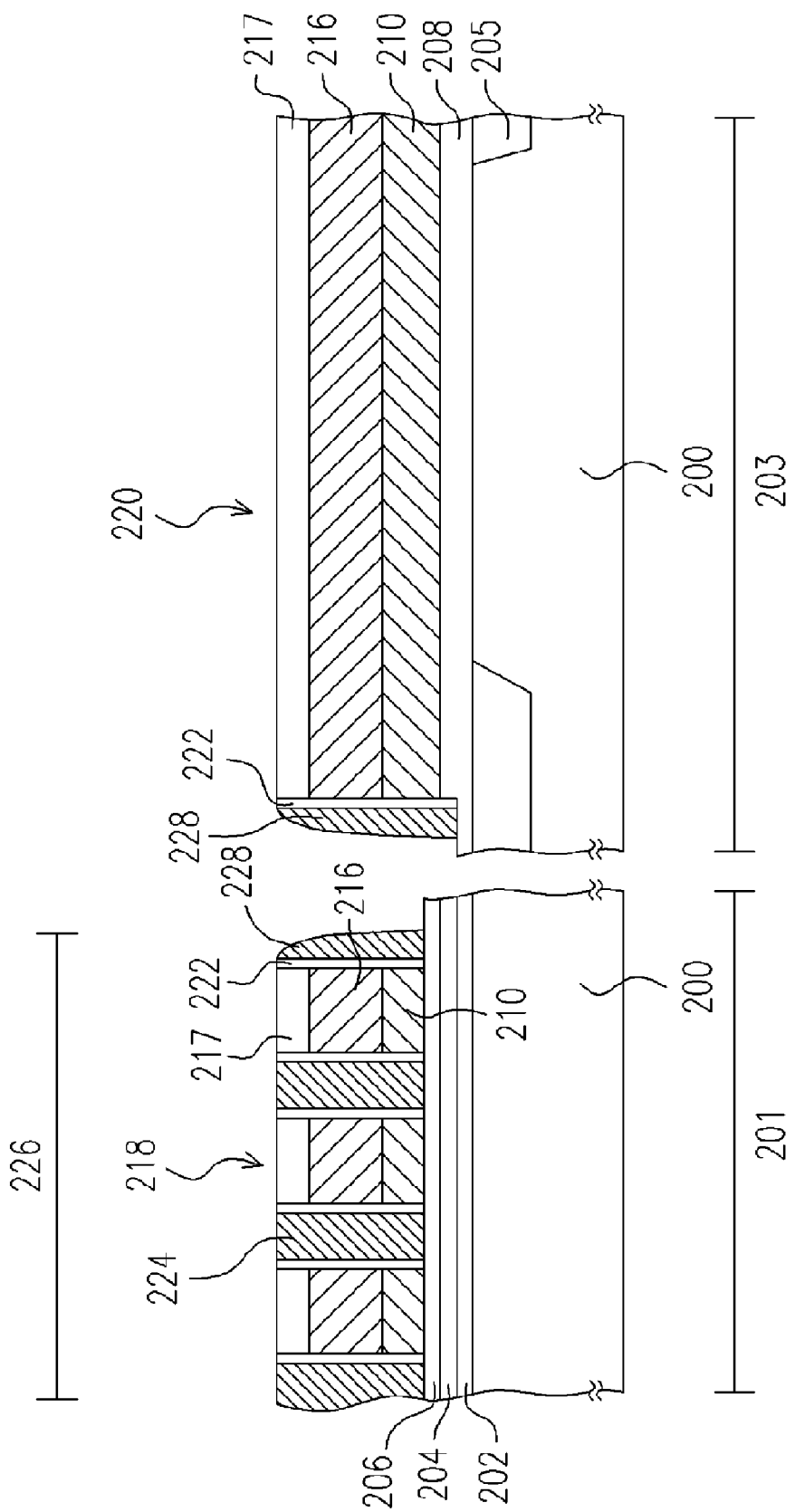
Figure 4:
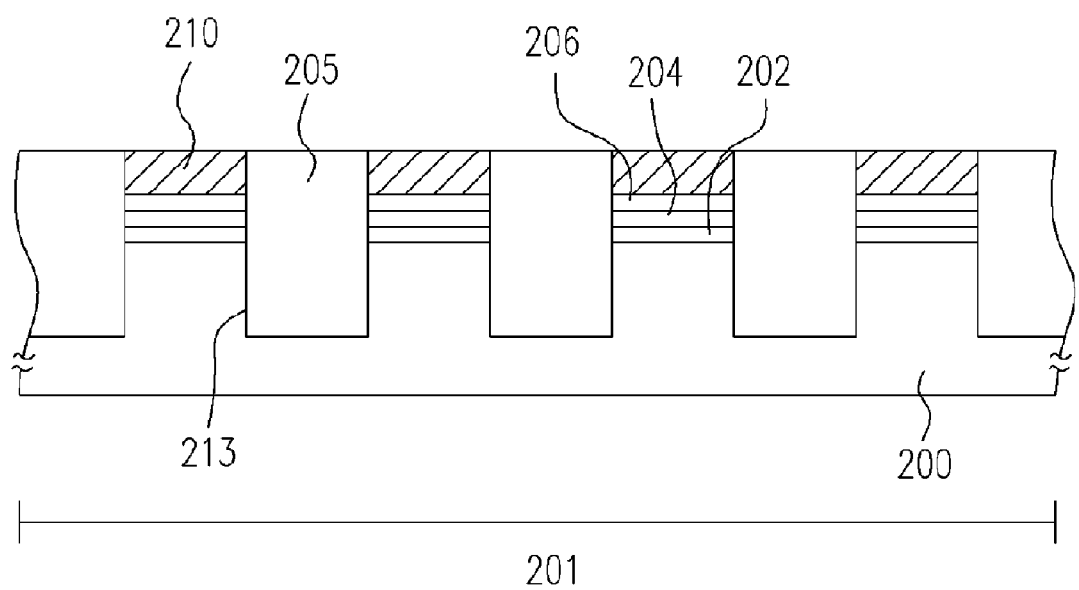
FIG. 4 is a schematic cross-sectional view along line II–II' of FIG. 2A.

As shown in FIGS. 2B and 3B, using the stacked structure 220 as a mask, a portion of the gate oxide layer 208 not covered by the stacked structure 220 on the peripheral circuit region 208 is removed. Then, a plurality of dielectric layers 222 is formed on the sidewalls of the stacked gate structures 218 and the stacked structure 220. The dielectric layers 222 are silicon oxide layers formed, for example, by performing a thermal oxidation process. Thereafter, a conductive layer (not shown) is formed over the substrate 200. The conductive layer is a doped polysilicon layer formed, for example, by performing a chemical vapor deposition process to form an undoped polysilicon layer and performing an ion implant process on the undoped polysilicon layer thereafter. After that, a portion of the conductive layer is removed to expose the surface of the stacked gate structures 218 and form a plurality of gates 224 between neighboring stacked gate structures 218, thereby forming a memory cell row 226. Furthermore, a plurality of conductive spacers 228 is formed on the sidewalls of the memory cell row 226 and the stacked structure 220. The method of removing a portion of the conductive layer includes, for example, performing an etching back operation.

Figure 3C:
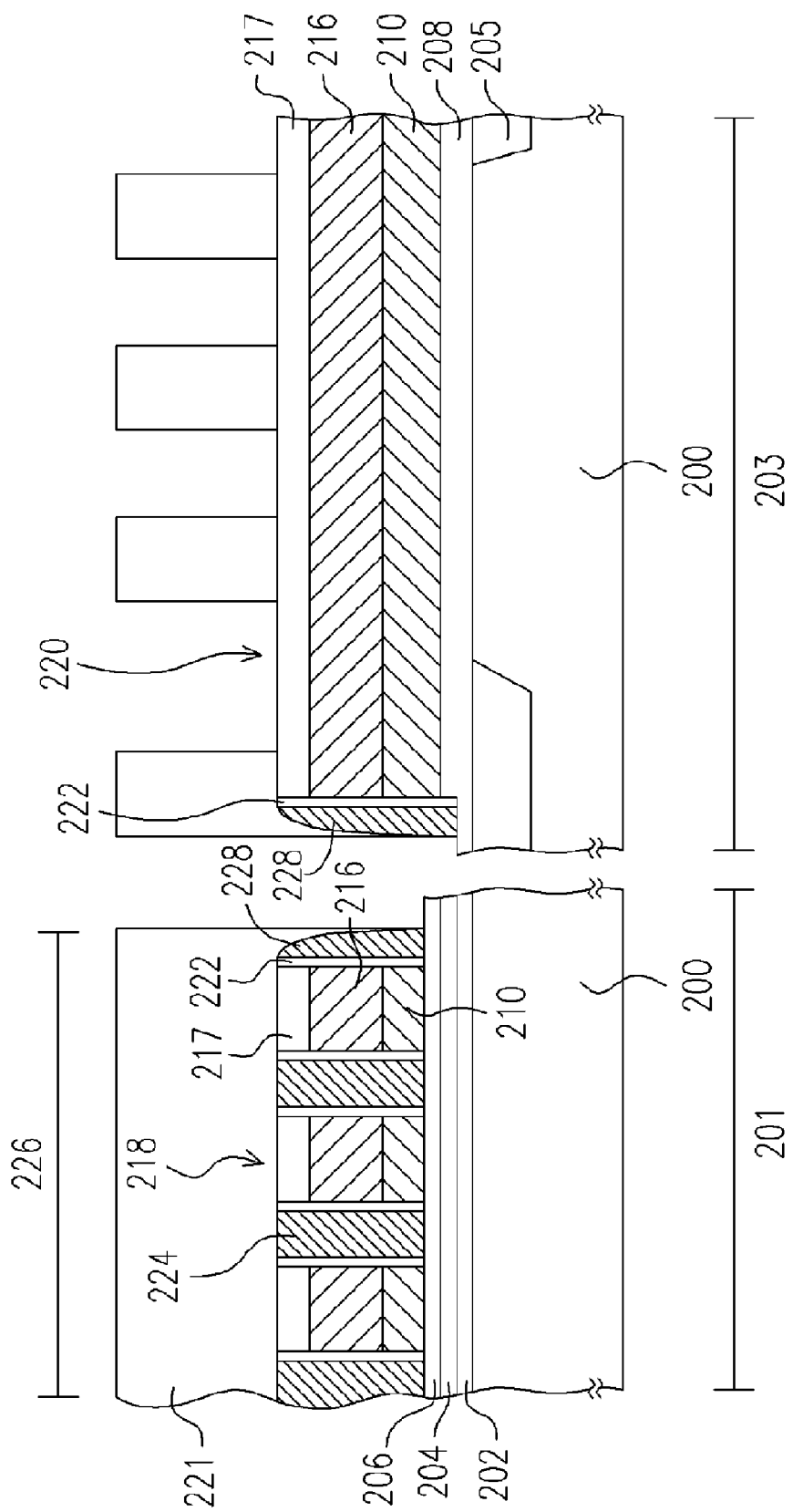

As shown in FIGS. 2B and 3C, a patterned mask layer 221 is formed on the substrate to define the stacked structure 220 so that a stacked gate structure 230 aligned in a direction perpendicular to the active region 209 is formed on the peripheral circuit region 203. The patterned mask layer 221 must cover the memory cell row 226 and the conductive spacers 228 to prevent the memory cell row 226 from being etched again. Thereafter, the patterned mask layer 221 is removed.

Figure 3D:
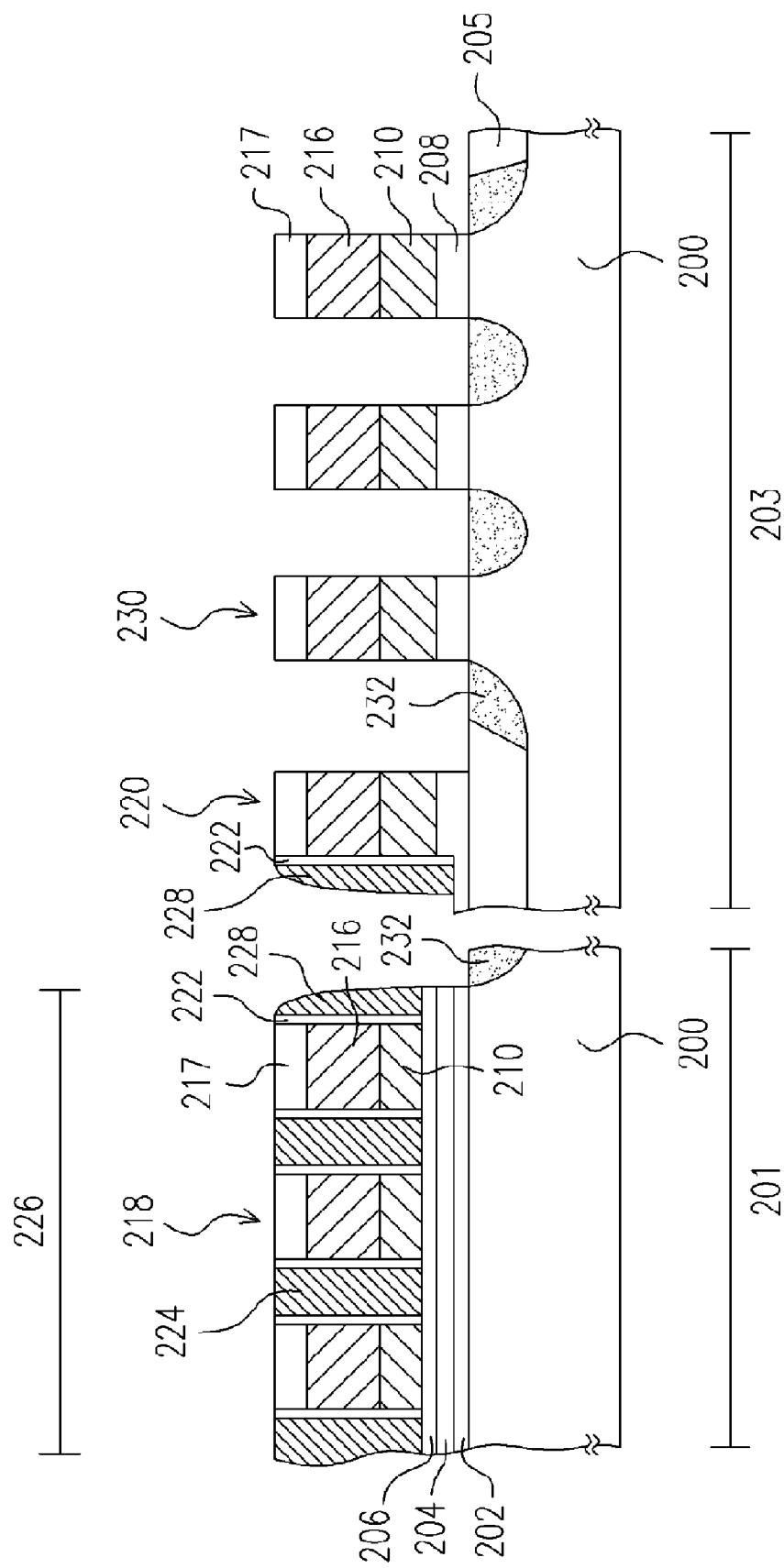

As shown in FIGS. 2C and 3D, the barrier dielectric layer 206, the charge-trapping layer 204 and the tunneling dielectric layer 202 not covered by memory cell row 226 are removed. Then, a plurality of source/drain regions 232 is formed in the substrate 200 on the respective sides of the memory cell row 226 and the stacked gate structure 230. The method of forming the source/drain regions 232 includes performing an ion implant process, for example.

In addition, the aforementioned memory cell row can be fabricated using another method. First, a patterned cap layer is used to define the conductive layer, the pad conductive layer, the barrier dielectric layer, the charge-trapping layer and the tunneling dielectric layer and form a plurality of first memory units. Then, a composite dielectric layer is formed to cover the substrate and the surface of the first memory units. The composite dielectric layer is an oxide/nitride/oxide composite stacked layer, for example. Thereafter, a conductive material layer is formed over the substrate. Then, a portion of the conductive material layer and the composite dielectric layer are removed to expose the first memory units. Hence, a second memory unit is formed between neighboring first memory units and the aforesaid memory cell row is formed. It should be noted that the material constituting the charge-trapping layer could be doped polysilicon beside silicon nitride in the above method.

In summary, the conductive layers of the stacked gate structures on the memory cell region and the peripheral circuit region in the present invention are formed in the same process. Therefore, the fabrication process can be shortened and the production cost can be reduced. In addition, the stacked structure 220 is defined to form the stacked gate structure 230 after forming the gates 224 and the conductive spacers 228. Hence, no conductive spacers are left on the sidewalls of the stacked gate structure 230 and there is no need to performing another process to remove the conductive spacers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a non-volatile memory, comprising:
   providing a substrate with a memory cell region and a peripheral circuit region, wherein a plurality of first stacked gate structures formed on the memory cell region of the substrate and a stacked structure formed on the peripheral circuit region of the substrate;
   forming a conductive layer over the substrate and etching back the conductive layer to form a plurality of gates between the first stacked gate structures and produce a memory cell row, and forming a plurality of conductive spacers on the sidewalls of the memory cell row and the stacked structure;
   forming a patterned mask layer over the substrate, wherein the patterned mask layer covers at least the memory cell row and the conductive spacers; and
   patterning the stacked structure to form a plurality of second stacked gate structures on the peripheral circuit region.

2. The method of claim 1, further comprises forming a plurality of source/drain regions in the substrate on the respective sides of the memory cell row and the second stacked gate structures.

3. The method of claim 2, wherein the step of forming the source/drain region comprises performing an ion implant process.

4. The method of claim 1, further comprises forming a plurality of dielectric layer on the sidewalls of the first stacked gate structures and the stacked structure before forming the conductive layer.

5. The method of claim 4, wherein the material constituting the dielectric layer comprises silicon oxide.

6. The method of claim 1, wherein each stacked gate structure comprises a pad conductive layer, a conductive layer and a patterned cap layer.

7. The method of claim 1, wherein the stacked structure comprises a pad conductive layer, a conductive layer and a patterned cap layer.

8. The method of claim 1, wherein the material constituting the conductive layer comprises doped polysilicon.

9. A method of fabricating a non-volatile memory, comprising the steps of:
   providing a substrate with a memory cell region and a peripheral circuit region, wherein a tunneling dielectric layer, a charge-trapping layer and a barrier dielectric layer are formed in sequence on the memory cell region of the substrate and a gate oxide layer is formed on the peripheral circuit region of the substrate;
   forming a pad conductive layer on the substrate;
   forming a device isolation structure in the substrate to define a plurality of first active region on the memory cell region and a second active region on the peripheral circuit region;
   forming a plurality of first memory units on the memory cell region and a stacked structure that covers at least the second active region on the peripheral circuit region;
   forming a first conductive layer over the substrate and etching back the first conductive layer to form a plurality of second memory units between the first memory units and produce a memory cell row, and forming a plurality of conductive spacers on the respective sidewalls of the memory cell row and the stacked structure;
   forming a patterned mask layer on the substrate, wherein the patterned mask layer covers at least the memory cell row and the conductive spacers;
   patterning the stacked structure to form a stacked gate structure on the second active region on the peripheral circuit region; and
   forming a plurality of source/drain regions in the substrate on the respective sides of the memory cell row and the stacked gate structures.

10. The method of claim 9, wherein the step of forming the device isolation structure comprises:
    forming a cap layer over the pad conductive layer;
    forming a plurality of openings through the cap layer, the pad conductive layer, the barrier dielectric layer, the charge-trapping layer, the tunneling dielectric layer and a portion of the substrate on the memory cell region and the pad conductive layer, the gate oxide layer and a portion of the substrate on the peripheral circuit region;
    depositing dielectric material into the openings, and removing the cap layer and a portion of the dielectric material layer.

11. The method of claim 9, wherein the step of forming the first memory units and the stacked structure comprises:
    forming a second conductive layer over the pad conductive layer; and
    defining the second conductive layer and the pad conductive layer.

12. The method of claim 9, wherein the step of forming the second memory cell units comprises:
    forming a composite dielectric layer on the substrate; and
    forming a third conductive layer between the first memory units.

13. The method of claim 12, wherein the composite dielectric layer comprises an oxide/nitride/oxide composite stacked layer.

14. The method of claim 9, wherein the material constituting the tunneling dielectric layer comprises silicon oxide.

15. The method of claim 9, wherein the step of forming the tunneling dielectric layer comprises performing a thermal oxidation process.

16. The method of claim 9, wherein the step of forming the charge-trapping layer comprises performing a chemical vapor deposition process.

17. The method of claim 9, wherein the material constituting the charge-trapping layer comprises silicon nitride or doped polysilicon.

18. The method of claim 9, wherein the step of forming the barrier dielectric layer comprises performing a chemical vapor deposition process.

19. The method of claim 9, wherein the material constituting the barrier dielectric layer comprises silicon oxide.

20. The method of claim 9, wherein the step of forming the gate oxide layer comprises performing a wet oxidation process.

21. The method of claim 9, wherein the material constituting the gate oxide layer comprises silicon oxide.

22. The method of claim 9, wherein the material constituting the pad conductive layer comprises doped polysilicon.

* * * * *